(12) United States Patent
Wang et al.

(10) Patent No.: US 8,707,144 B2
(45) Date of Patent: Apr. 22, 2014

(54) LDPC DECODER WITH TARGETED SYMBOL FLIPPING

(75) Inventors: Chung-Li Wang, San Jose, CA (US); Zongwang Li, San Jose, CA (US); Shaohua Yang, San Jose, CA (US)

(73) Assignee: LSI Corporation, Milpitas, CA (US)

(*) Notice: Subject to any disclaimer, the term of this patent is extended or adjusted under 35 U.S.C. 154(b) by 163 days.

(21) Appl. No.: 13/274,443

(22) Filed: Oct. 17, 2011

(65) Prior Publication Data

US 2013/0097475 A1    Apr. 18, 2013

(51) Int. Cl.
   *H03M 13/00* (2006.01)

(52) U.S. Cl.
   USPC ............ 714/784; 714/752; 714/755; 714/758

(58) Field of Classification Search
   USPC .......................................... 714/752, 758, 784
   See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,701,314 A | 12/1997 | Armstrong |
| 5,710,784 A | 1/1998 | Kindred |
| 5,712,861 A | 1/1998 | Inoue |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |

(Continued)

OTHER PUBLICATIONS

Liu et al. Weighted Symbol-Flipping Decoding of non-binary LDPC codes. 2010, Second International Conference on Network Security, wireless communication and trusted computing, IEEE pp. 223-226.*

(Continued)

*Primary Examiner* — Sam Rizk
(74) *Attorney, Agent, or Firm* — Hamilton DeSanctis & Cha

(57) ABSTRACT

A non-binary low density parity check data decoder comprises a variable node processor operable to update variable node symbol values according to a plurality of elements in a non-binary Galois Field, a check node processor connected to the variable node processor and operable to perform parity check calculations, and a controller operable to perform symbol flipping and to control decoding iterations in the variable node processor and the check node processor.

20 Claims, 6 Drawing Sheets

(56) References Cited

U.S. PATENT DOCUMENTS

| | | | |
|---|---|---|---|
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,438,717 | B1 | 8/2002 | Butler |
| 6,473,878 | B1 | 10/2002 | Wei |
| 6,535,553 | B1 | 3/2003 | Limberg et al. |
| 6,625,775 | B1 | 9/2003 | Kim |
| 6,657,803 | B1 | 12/2003 | Ling |
| 6,748,034 | B2 | 6/2004 | Hattori |
| 6,757,862 | B1 | 6/2004 | Marianetti, II |
| 6,771,197 | B1 * | 8/2004 | Yedidia et al. ............... 341/107 |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,136,244 | B1 | 11/2006 | Rothberg |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,730,384 | B2 | 6/2010 | Graef |
| 7,738,201 | B2 | 6/2010 | Jin |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,958,425 | B2 | 6/2011 | Chugg |
| 7,996,746 | B2 | 8/2011 | Livshitz |
| 8,201,051 | B2 | 6/2012 | Tan |
| 8,291,284 | B2 | 10/2012 | Savin |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |

OTHER PUBLICATIONS

Zhang et al. LDPC Codes for Rank Modulation in Flash Memories, Jun. 2010, ISIT IEEE , pp. 859-863.*

Liu et al. Weighted Symbol-Flipping Decoding for Nonbinary LDPC Codes, Apr. 2010, 2010 second international conference on Network secuirty. pp. 223-226.*

Liu et al. Weighted symbol-flipping decoding for nonbinary codes, Apr. 2010, IEEE Explore, pp. 1-2.*

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Declercq, "Decoding Algorithms for Nonbinary LDPC Codes over GF(q)", IEEE Trans. on Commun., vol. 55(4), pp. 633-643 (Apr. 2007).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kang et al., "A Two-Stage Iterative Decoding of LDPC Codes for Lowering Error Floors", IEEE GLOBECOM Proceedings, 1088-1091 (2008).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Olmos et al., "Tree-Structure Expectation Propagation for LDPC Decoding in Erasure Channels", Cornell University Library arXiv:1009.4287 (Sep. 22, 2010).

Shokrollahi "LDPC Codes: An Introduction", Digital Fountain, Inc. (Apr. 2, 2003).

Spagnol et al, "Hardware Implementation of GF($2^{\wedge}$ m) LDPC Decoders", IEEE Transactions on Circuits and Systemssi: Regular Papers, Vol. 56, No. 12 (December 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/227,538, Unpublished (filed Sep. 8, 2011) (Shaohua Yang).

U.S. Appl. No. 13/167,764, Unpublished (filed Jun. 24, 2011) (Zongwang Li).

U.S. Appl. No. 13/251,340, Unpublished (filed Oct. 3, 2011) (Haitao Xia).

U.S. Appl. No. 13/180,495, Unpublished (filed Jul. 11, 2011) (Chung-Li Wang).

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

(56) References Cited

OTHER PUBLICATIONS

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Wymeersch et al., "Log-Domain Decoding of LDPC Codes Over GF(q)", IEEE Int. Conf. on Commun., vol. 2, pp. 772-776 (Jun. 2004).

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. On Information Theory, vol. 57, No. 10 (Oct. 2011).

Zhao, "Joint Detection/Decoding Algorithms for Nonbinary LDPC Codes over ISI Channels" [online] [ret. On Nov. 9, 2012] Ret. From Internet: http://arxiv.org/abs/1209.2542v1.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong et al., "Joint Code-Encoder Design for LDPC Coding System VLSI Implementation", ISCAS, IEEE pp. 389-392, May 2004.

Zhong et al., "High-Rate Quasi-Cyclic LDPC Codes for Magnetic Recording Channel with Low Error Floor", ISCAS, IEEE pp. 3546-3549, May 2006.

Zhong et al., "Design of VLSI Implementation-Oriented LDPC Codes", IEEE, pp. 670-673, 2003.

Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

LDPC DECODER WITH TARGETED SYMBOL FLIPPING

BACKGROUND

Digital information storage and transmission has become ubiquitous in practically every facet of life throughout most of the world. Various data transfer systems have been developed including storage systems, cellular telephone systems, and radio transmission systems.

In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback.

Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

Although LDPC decoders in general approach the Shannon limit, the theoretical capacity of a communications channel to transfer information for a particular noise level, a need remains for improvements in LDPC decoders, particularly when they fail to converge or fail to properly decode data.

BRIEF SUMMARY

Various embodiments of the present invention are related to apparatuses and methods for decoding data, and more particularly to apparatuses and methods for decoding data in a non-binary low density parity check (LDPC) decoder with targeted symbol flipping. For example, a non-binary low density parity check data decoder is disclosed that comprises a variable node processor operable to update variable node symbol values according to a plurality of elements in a non-binary Galois Field, a check node processor connected to the variable node processor and operable to perform parity check calculations, and a controller operable to perform symbol flipping and to control decoding iterations in the variable node processor and the check node processor. In some embodiments, the symbol flipping comprises changing at least one of the variable node symbol values to another of the plurality of elements in the non-binary Galois Field, for example by changing a hard decision value and a corresponding log likelihood ratio value of the symbols being flipped. In some embodiments, the controller is operable to perform the symbol flipping in a plurality of modes of operation, with each of the modes of operation sequentially invoked if a previously invoked mode of operation failed to satisfy all check node constraints. In some instances, a first of the modes of operation comprises flipping a value of a single symbol at a time across a pool of symbols in an unsatisfied check pool and performing local decoding iterations. In some instances, a second of the plurality of modes of operation comprises a first stage in which a plurality of new unsatisfied check pools are generated by performing double symbol flipping across the unsatisfied check pool and performing local decoding iterations, and a second stage comprising performing double symbol flipping across each of the plurality of new unsatisfied check pools and performing local decoding iterations. In some instances, symbols flipped in the first stage are not flipped in the second stage. In some embodiments, a third of the plurality of modes of operation comprises a first stage in which a second plurality of new unsatisfied check pools are generated by performing double symbol flipping across the unsatisfied check pool and performing parity checks without local decoding iterations, and a second stage comprising performing double symbol flipping across each of the second plurality of new unsatisfied check pools and performing local decoding iterations.

Other embodiments provide a method for decoding low density parity check encoded data, including performing a limited number of global and local decoding iterations in a non-binary low density parity check data decoder, and when the global and local decoding iterations fail to converge by satisfying all check node parity checks, performing a symbol flipping operation comprising exhaustively flipping values of symbols in the encoded data across all elements of a Galois Field associated with the non-binary low density parity check data decoder. In some embodiments of the method, the symbol flipping operation comprises a number of operating modes at least one of which comprises flipping a single symbol value at a time and at least one of which comprises flipping multiple symbol values at a time.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
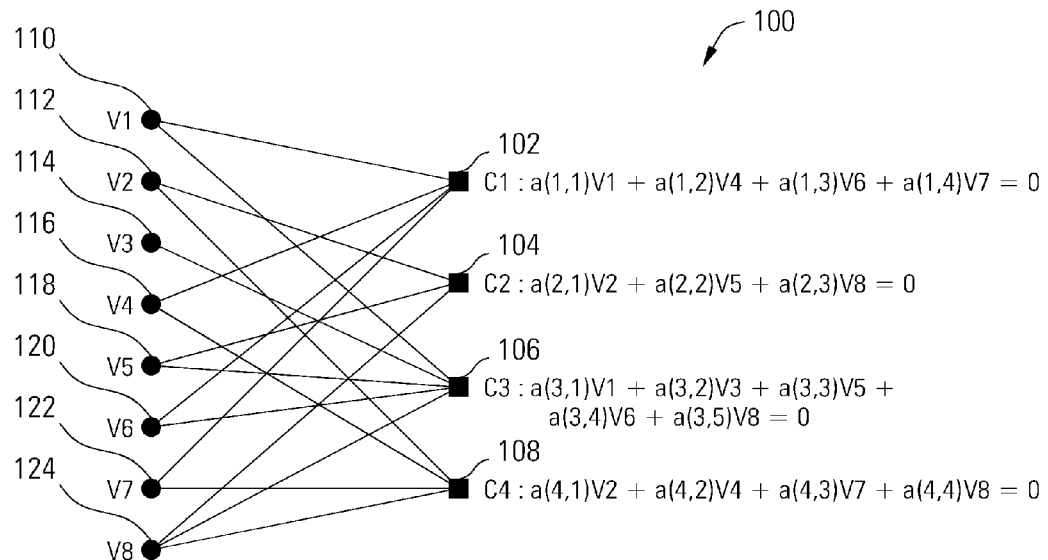
FIG. 1 depicts a Tanner graph of an example prior art non-binary LDPC code.

Various embodiments of the present invention are related to apparatuses and methods for decoding data, and more particularly to apparatuses and methods for decoding data in a non-binary LDPC decoder with targeted symbol flipping. The targeted symbol flipping is initiated when normal decoding fails, for example when the original data cannot be recovered from hard decisions produced by the normal decoding. Decoding failure can be caused by an imperfect codeword that generates no failed parity checks even when the original data has not been properly recovered, or because of trapping sets, sets of variables nodes that are not well connected in the Tanner graph. During targeted symbol flipping, the input hard decision and LLR values to the LDPC decoder for symbols being flipped are changed in an attempt to cause the LDPC decoder to converge.

The term "symbol flipping" is used herein to refer to changing the input values to the LDPC decoder of the symbols being flipped to different elements of the Galois Field. For example, in a GF(4) decoder, the symbol may be flipped by adding 1, 2 or 3 to the hard decision. The symbol flipping may be performed in any manner suitable to the particular LDPC decoder and the format of its input. For example, the input to the LDPC decoder may consist of a hard decision identifying one of the Galois Field elements as the most likely real value along with an LLR value for each of the other Galois Field elements, indicating the likelihood that the real value is each of the other Galois Field elements. In other embodiments, the LLR values may indicate the likelihood that the real value is higher or lower than the hard decision. The non-binary LDPC decoder with targeted symbol flipping is not limited to use with any input format, and the symbol flipping of the input is adapted to the input format of the LDPC decoder.

The term "targeted" is used herein to indicate that the symbols to be flipped are selectively chosen from unsatisfied check pools, sets of check nodes for which parity check constraints are violated. The variable nodes connected to each check node for which parity check constraints are violated are members of the unsatisfied check pool. In some embodiments, parity check constraints are violated if any check node fails a parity check.

If the non-binary LDPC decoder with targeted symbol flipping fails to converge during normal decoding operations, a controller in the LDPC decoder changes or flips the values of one or more selected symbols and retries decoding iterations in multiple modes of operation until the decoding converges or until all modes of targeted symbol flipping have been completed. As symbols are flipped, trying various possible values from the Galois Field for each flipped symbol, the LLR values corresponding to the flipped symbols are set in some embodiments to their full confidence value. Each mode performs exhaustive symbol flipping, trying each possible value of each symbol in an unsatisfied check pool until the data converges or the exhaustive trials are completed for the mode. If a mode completes without converging, the next mode of targeted symbol flipping is performed until all modes have been completed.

In some embodiments, three modes are provided. In a first mode, one symbol at a time in the unsatisfied check pool is flipped through each possible value in the Galois Field and decoding iterations repeated, exhaustively trying every possible value for every symbol in the unsatisfied check pool.

In a second mode, performed if the first mode fails to converge, two symbols at a time from the unsatisfied check pool are flipped through each possible combination of values in the Galois Field and decoding iterations are repeated.

In a third mode, performed if the second mode fails to converge, two symbols at a time from the unsatisfied check pool are flipped through each possible combination of values in the Galois Field, and parity checks are performed in the decoder without performing a decoding iteration to produce a new unsatisfied check pool. The operation of mode two is performed on the new unsatisfied check pool, flipping two symbols at a time from the new unsatisfied check pool through each possible combination of values in the Galois Field and repeating decoding iterations with the new values to determine whether the data will converge with the new values. If the targeted symbol flipping for the new unsatisfied check pool fails to converge, another two symbols from the original unsatisfied check pool are flipped to produce another new unsatisfied check pool and the process continues, exhaustively flipping symbols in all possible pairings from the original unsatisfied check pool to generate new unsatisfied check pools, then performing targeted symbol flipping in pairs exhaustively over the new unsatisfied check pools until the data converges or the exhaustive trials are completed. If the three modes fail to result in convergence, decoding may be halted or other error recovery techniques may be applied.

Figure 2:
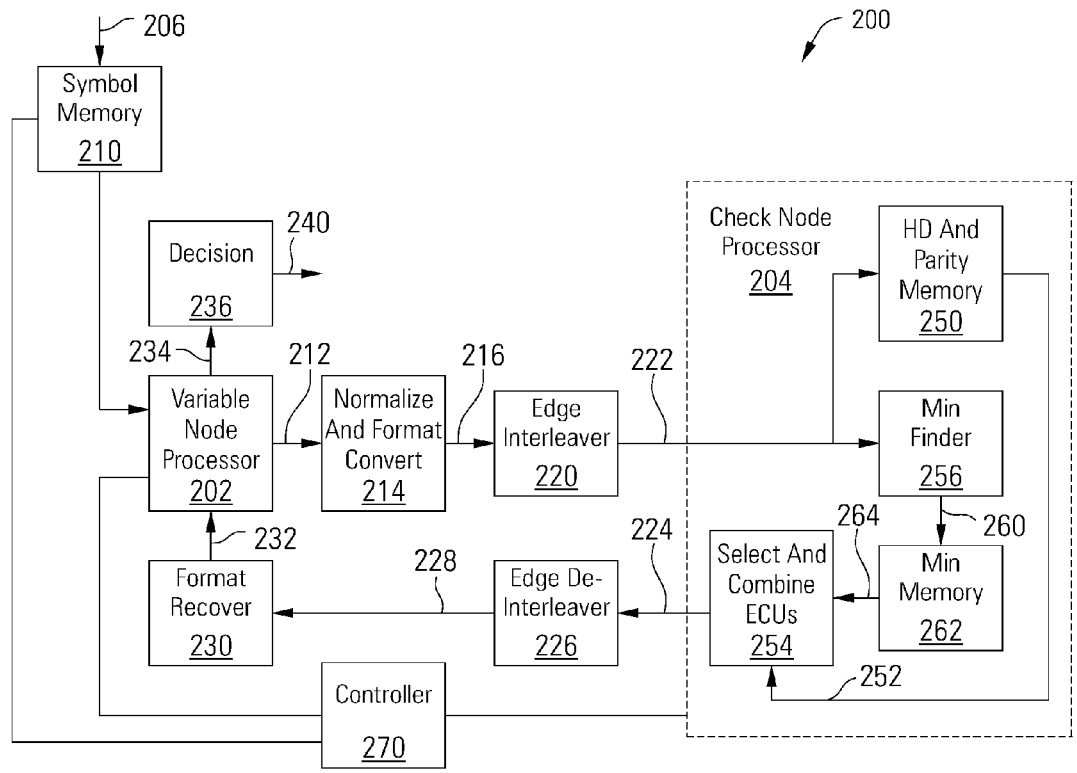
FIG. 2 depicts a block diagram of a min-sum based non-binary LDPC decoder in accordance with various embodiments of the present invention.

Turning to FIG. 2, the non-binary LDPC decoder with targeted symbol flipping may be, but is not limited to, a min-sum based LDPC decoder 200 in which check nodes calculate a minimum, next minimum and hard decision value based on incoming V2C or variable node message vectors. However, it is important to note that the targeted symbol flipping is not limited to the min-sum based non-binary LDPC decoder 200 of FIG. 2, but that any non-binary LDPC decoder may be adapted to use the targeted symbol flipping and the multiple symbol flipping modes disclosed herein.

The min-sum based non-binary LDPC decoder 200 is provided with an input 206, for example containing a hard decision and corresponding LLR values, which are stored in a symbol memory 210. The input 206 is provided to the variable node processor 202 from the symbol memory 210, and the variable node processor 202 updates the perceived value of each symbol based on the value from input 206 and on C2V message vectors or check node messages from a check node processor 204. The variable node processor 202 also generates V2C message vectors 212 or variable node messages for neighboring check nodes.

Check nodes (implemented in check node processor 204) in a min-sum based non-binary LDPC decoder receive incoming messages from connected or neighboring variable nodes (implemented in variable node processor 202) and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message with for each neighboring variable node.

In various embodiments of LDPC decoders that may be adapted for use with targeted symbol flipping, the variable node processor 202 and check node processor 204 may each be unitary, discrete components, or their functions may be distributed and intermixed in multiple components. The terms variable node processor and check node processor are therefore not limited to two discrete processing components, but apply generally to any components or combinations of components in an LDPC decoder that update variable node values and generate variable node to check node messages for variable node processing, and that perform check node constraint calculations and generate check node to variable node messages for check node processing.

Both V2C and C2V messages are vectors, each including a number of sub-messages with LLR values. Each V2C message vector from a particular variable node contains sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, the check nodes calculate the minimum sub-message $\min_1(d)$, the index idx(d) of $\min_1(d)$, and the sub-minimum sub-message $\min_2(d)$, or minimum of all sub-messages excluding $\min_1(d)$, for each nonzero symbol d in the Galois Field based on all extrinsic V2C messages from neighboring variable nodes. In other words, the sub-messages for a particular symbol d are gathered from messages from all extrinsic inputs, and the $\min_1$), idx(d) and $\min_2(d)$ is calculated based on the gathered sub-messages for that symbol d. For a Galois Field with q symbols, the check node will calculate the $\min_1(d)$, idx(d) and $\min_2(d)$ sub-message for each of the q−1 non-zero symbols in the field except the most likely symbol.

The V2C message vectors 212 from the variable node processor 202 are provided to a message format converter 214 which converts the format of V2C message vectors 212 to a format consisting of two parts, the most likely symbol, and the LLR of other symbols, normalized to the most likely symbol, yielding normalized V2C message vectors 216 in the second format. Message normalization in the message format converter 214 is performed with respect to the most likely symbol. Thus, the V2C and C2V vector format includes two parts, an identification of the most likely symbol and the LLR for the other q−1 symbols, since the most likely symbol has LLR equal to 0 after normalization. The normalized V2C message vectors 216 are provided to an edge interleaver 220 which shuffles messages on the boundaries at message edges, randomizing noise and breaking dependencies between messages. The interleaved normalized V2C message vectors 222 are provided to the check node processor 204, which generates C2V messages 224 for each neighboring variable node processor based on extrinsic V2C messages from other neighboring variable node processors.

The C2V messages 224 are provided to an edge de-interleaver 226, which reverses the process of the edge interleaver 220, and then to a format recovery circuit 230, which converts message vectors from the second, normalized format to the first message vector format of the variable node processor 202, reversing the process of the message format converter 214. The resulting first format C2V messages 232 are provided to the variable node processor 202 for use in updating perceived LLR values in variable nodes. In other embodiments, the variable node processor 202 is adapted to operate directly with message vectors of the second, normalized format. In these embodiments, the message format converter 214 and format recovery circuit 230 are omitted.

When the values in the min-sum based non-binary LDPC decoder 200 converge and stabilize, or when a limit is reached on the number of local iterations, the variable node processor 202 provides the total LLR $S_n(a)$ 234 to a decision circuit 236 to generate a hard decision 240 based on the $\operatorname{argmin}_a$ of the total LLR $S_n(a)$.

The check node processor 204 includes a hard decision and parity memory circuit 250 that processes the interleaved normalized V2C message vectors 222 to provide the most likely symbol 252 to a select and combine circuit 254 having a number of elementary computation units (ECUs). The check node processor 204 also includes a min finder 256 that calculates the $\min_1(d)$, idx(d) and $\min_2(d)$ sub-messages 260 for each of the q symbols in the Galois Field and stores them in a min memory 262. The stored $\min_1(d)$, idx(d) and $\min_2(d)$ sub-messages 264 are provided by min memory 262 to the select and combine circuit 254. The select and combine circuit 254 combines the $\min_1(d)$, idx(d) and $\min_2(d)$ sub-messages 264 and the most likely symbol 252 to generate the C2V messages 224.

The message vector format conversion performed by message format converter 214 on V2C message vectors 212 is reversed by format recovery circuit 230, providing C2V messages 232 to variable node processor 202 in the format used by the variable node processor 202.

A controller 270 in the min-sum based non-binary LDPC decoder 200 controls the decoding operation and iterations in the variable node processor 202 and check node processor 204, and the multiple modes of targeted symbol flipping when the normal decoding operation in the min-sum based non-binary LDPC decoder 200 fails to converge. For example, in various embodiments, the controller 270 is adapted to initiate decoding operations, to set the number of local iterations in the min-sum based non-binary LDPC decoder 200, and to flip input values for symbols, for example by changing their values in the symbol memory 210, or in the variable node processor 202.

Again, the non-binary LDPC decoder with targeted symbol flipping is not limited to the example min-sum based LDPC decoder 200 of FIG. 2, and any non-binary LDPC decoder may be adapted to use with the multiple mode targeted symbol flipping disclosed herein.

Figure 3:
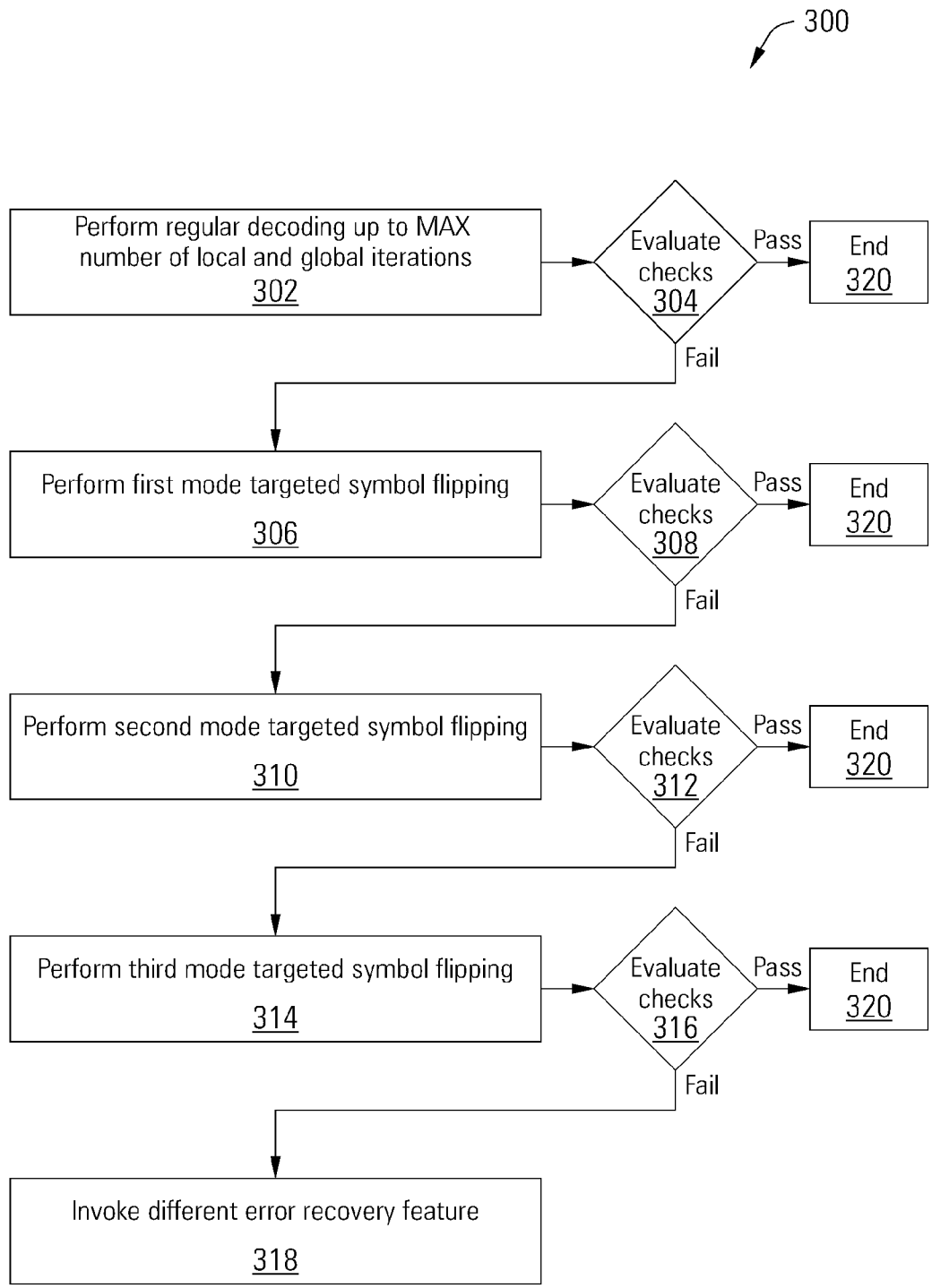
FIG. 3 depicts a flow diagram showing a method for decoding data in a non-binary LDPC decoder with multi-mode targeted symbol flipping in accordance with various embodiments of the present invention.

Turning to FIG. 3, a flow diagram 300 shows a method for decoding data in a non-binary LDPC decoder with multi-mode targeted symbol flipping in accordance with various embodiments of the present invention, for example in an LDPC decoder such as min-sum based non-binary LDPC decoder 200 of FIG. 2 under the control of controller 270. Following flow diagram 300, regular decoding is performed in a non-binary LDPC decoder. (Block 302) If the maximum number of local and global iterations is are reached before the data converges in the non-binary LDPC decoder, a check is performed to determine whether the data converged, based on whether the number of unsatisfied checks (USCN) is greater than zero. (Block 304) If the number of unsatisfied checks is zero, the decoding process is ended. (Block 320) In some embodiments, the decoding process is also ended if the number of unsatisfied checks exceeds a correctable error limit beyond which the targeted symbol flipping cannot be expected to correct the errors. If the number of unsatisfied checks is above zero and, in some embodiments, below the correctable error limit, a first mode of targeted symbol flipping is performed. (Block 306) In the first mode, one single symbol at a time from the pool of unsatisfied checks is flipped through each possible value in the Galois Field, repeating the decoding after every change, to determine whether the data converges for each of the flipped symbols.

Decoding is repeated by performing local iterations in the LDPC decoder until the data converges or until the maximum number of local iterations is reached. Again, symbols are flipped by changing the value of the symbol at the input (e.g., 206) to the LDPC decoder (e.g., 200), and the manner in which the symbol value is set is dependent on the input format of the LDPC decoder. For example, changing a symbol value may include adding one, two or three to the input hard decision value for the symbol in a GF(4) LDPC decoder, along with saturating the corresponding LLR value by setting it to the highest confidence level, such as 15. The pool of unsatisfied checks includes all variable nodes connected to check nodes for which parity check constraints are violated during regular decoding in block 302 prior to the first mode of targeted symbol flipping in block 306.

After exhaustive trials are performed in the first mode of targeted symbol flipping, performing local decoding iterations for every possible value of every symbol in the unsatisfied check pool, the unsatisfied checks resulting from the first mode of targeted symbol flipping are evaluated. (Block 308) If the number of unsatisfied checks is zero for any value of the flipped symbols, the decoding process is ended. (Block 320)

If the number of unsatisfied checks from the first mode of targeted symbol flipping is above zero and, in some embodiments, below the correctable error limit, a second mode of targeted symbol flipping is performed. (Block 310) In the second mode, two symbols at a time from the pool of unsatisfied checks after normal decoding are flipped through each possible value in the Galois Field, repeating the decoding after every change, to determine whether the data converges for each of the flipped symbols. As will be disclosed in more detail below, the second mode of targeted symbol flipping includes a first stage of operation and a second stage of operation. After exhaustive trials are performed in the second mode of targeted symbol flipping, the unsatisfied checks resulting from the second mode of targeted symbol flipping are evaluated. (Block 312) If the number of unsatisfied checks is zero for any values of the flipped symbols, the decoding process is ended. (Block 320)

If the number of unsatisfied checks from the second mode of targeted symbol flipping is above zero and, in some embodiments, below the correctable error limit, a third mode of targeted symbol flipping is performed. (Block 310) In the third mode, two symbols at a time are again flipped, but in this case generating secondary unsatisfied check pools using rapid parity check operations. After exhaustive trials are performed in the third mode of targeted symbol flipping, the unsatisfied checks resulting from the third mode of targeted symbol flipping are evaluated. (Block 316) If the number of unsatisfied checks is zero for any values of the flipped symbols, the decoding process is ended. (Block 320) If the number of unsatisfied checks is greater than zero, a different error recovery feature may be invoked (Block 318), or decoding may be terminated with a failure signal.

Figure 4:
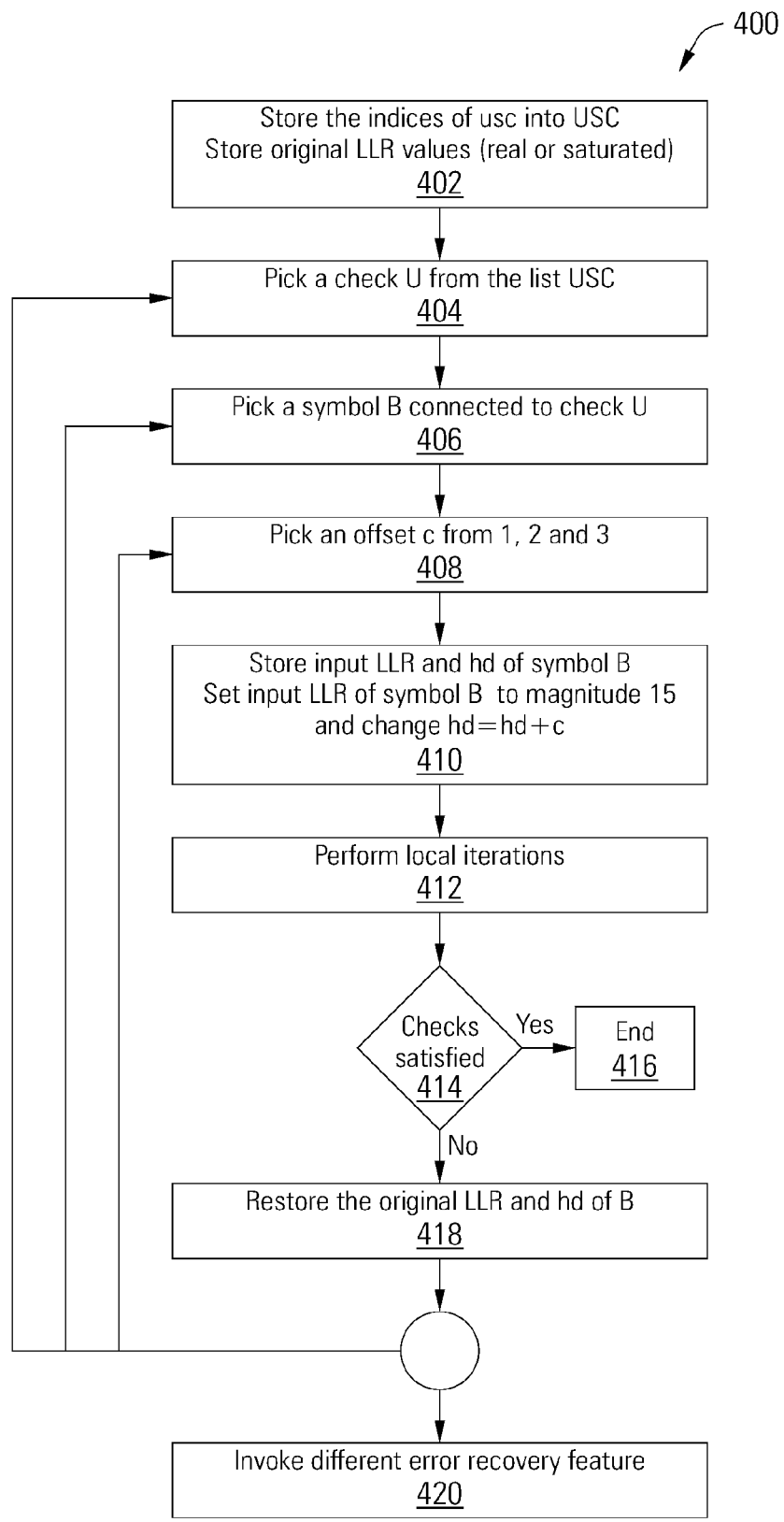
FIG. 4 depicts a flow diagram showing a method for decoding data in a non-binary LDPC decoder using a first targeted symbol flipping mode in accordance with various embodiments of the present invention.

Turning to FIG. 4, a flow diagram 400 shows a method for decoding data in a non-binary LDPC decoder using a first targeted symbol flipping mode in accordance with various embodiments of the present invention. Following flow diagram 400, all variable nodes connected to check nodes for which parity check constraints are violated during regular decoding are added to the unsatisfied check pool, and the original LLR values for those variable nodes are stored, whether real values or saturated values. (Block 402) This may be accomplished in some embodiments by storing the indices of unsatisfied checks into a pool variable or memory USC. A check U is selected from the unsatisfied check pool USC. (Block 404) A symbol B connected to check U is selected for flipping. (Block 406) An offset c is selected to apply to symbol B. (Block 408) For example, with a Galois Field of 4, the offset may be 1, 2 or 3, with the symbol value wrapping around when adding the offset when the maximum value is reached. In some embodiments in which the input includes a hard decision and LLR value, the original input (e.g., the hard decision and LLR value) of symbol B is stored, offset c is applied to symbol B, and the LLR of symbol B is saturated, for example by setting it to magnitude 15. (Block 410) In other embodiments with an input format not having a hard decision and LLR value, the storing of the original input value for symbol B and the flipping to another element of the Galois Field is adapted to the input format. Local decoding iterations are performed, up to the maximum number set to limit local iterations. (Block 412) The number of unsatisfied checks are then examined to determine whether any unsatisfied checks remain. (Block 414) If not, decoding is finished. (Block 416)

In some embodiments, the predetermined number of local iterations are performed before examining the number of unsatisfied checks, in other embodiments, other techniques for determining if data converges before completing the predetermined number of local iterations may be applied. In the latter cases, the checks to determine whether data converges (e.g., block 414) are performed during local iterations without waiting for the predetermined number of local iterations are completed.

If the number of unsatisfied checks is greater than zero (and, in some embodiments, less than a correctable error limit), the original value of symbol B is restored, for example by restoring the original hard decision and LLR value. (Block 418) The exhaustive trials are then continued by selecting the next offset c (Block 408) for the symbol B of check U until all offsets have been trialed for symbol B, then by flipping values and running trials for the next symbol B (Block 406) of check U until all symbols have been trialed for check U, then by flipping values and running trials for the next check U (Block 404) until all checks in the unsatisfied check pool USC have been trialed, examining the number of unsatisfied checks (Block 414) after each trial and finishing decoding (Block 416) if any flipped symbol value results in no unsatisfied checks. If the first targeted symbol flipping mode of FIG. 4 does not succeed in satisfying all checks, a different error recovery feature may be invoked (Block 420), such as the second targeted symbol flipping mode, an example embodiment of which is illustrated in FIG. 5.

Figure 5:
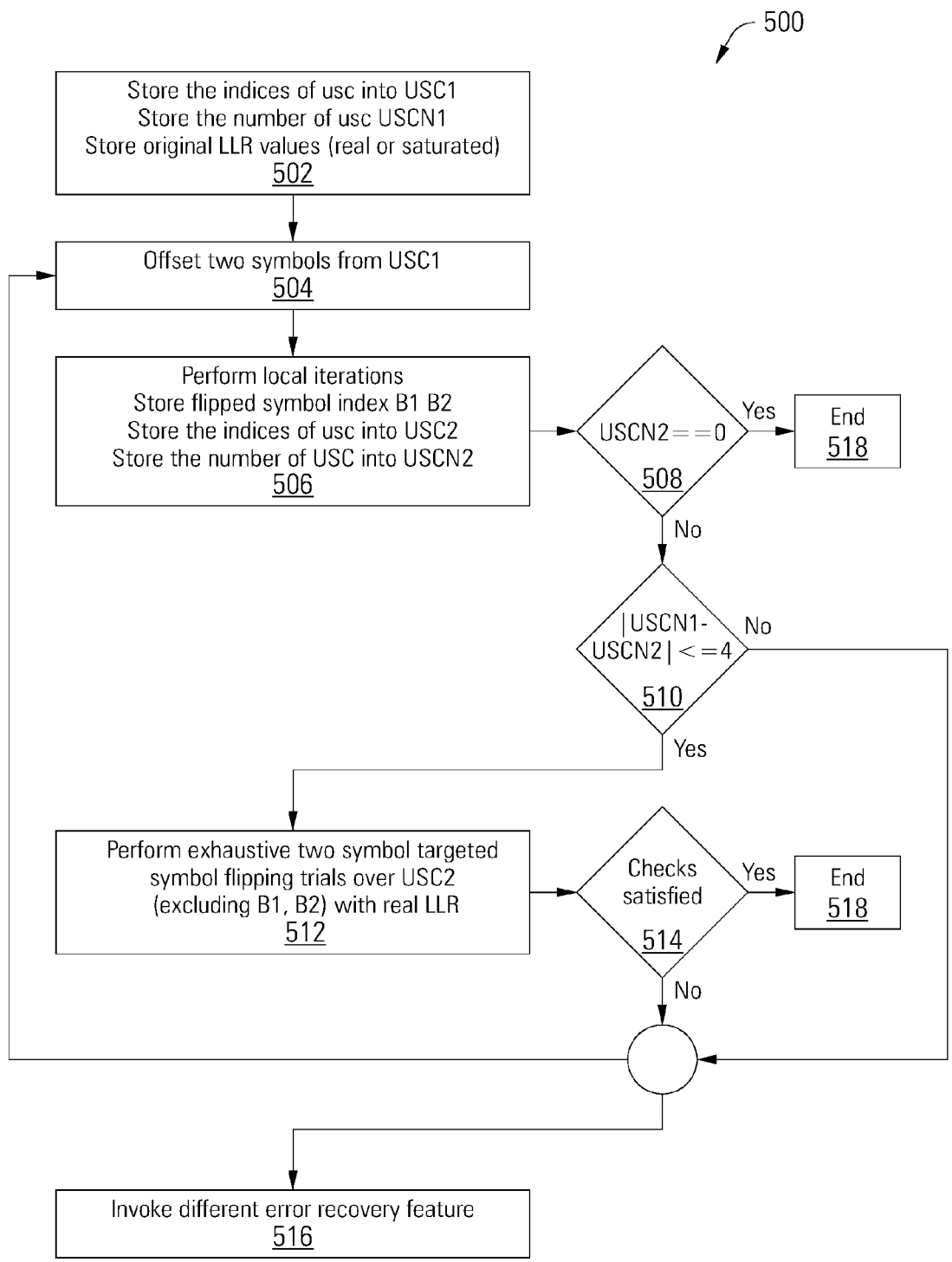
FIG. 5 depicts a flow diagram showing a method for decoding data in a non-binary LDPC decoder using a second targeted symbol flipping mode in accordance with various embodiments of the present invention.

Turning to FIG. 5, a flow diagram 500 shows a method for decoding data in a non-binary LDPC decoder using a second targeted symbol flipping mode in accordance with various embodiments of the present invention. In the second targeted symbol flipping mode, two symbols are flipped simultaneously. This enables the LDPC decoder to converge when the trapping set is a combination of two smaller trapping sets and a single flipped symbol is not able to compensate for the two smaller trapping sets. The second targeted symbol flipping mode also includes two stages, a first stage which includes flipping two symbols simultaneously and running trials to generate new unsatisfied check pools, and a second stage which performs exhaustive two-symbol flipping trials across the new unsatisfied check pools.

Following flow diagram 500, all variable nodes connected to check nodes for which parity check constraints are violated during regular decoding are added to the unsatisfied check pool, the number of unsatisfied checks is stored, and the original LLR values for those variable nodes are stored, whether real values or saturated values. (Block 502) This may be accomplished in some embodiments by storing the indices of unsatisfied checks into a pool variable or memory USC1 and storing the number of unsatisfied checks in a variable USCN1. Two symbols from the unsatisfied check pool are flipped or offset. (Block 504) Local decoding iterations are performed with the input data having two flipped symbols, generating a new unsatisfied check pool for use in the second stage. The new unsatisfied check pool is formed by adding all variable nodes connected to check nodes for which parity check constraints are violated with the two flipped symbols to the new unsatisfied check pool USC2. The indices B1 and B2 of the two flipped symbols used to generate the new unsatisfied check pool USC2 are also stored, along with the number of unsatisfied checks USCN2 during local decoding iterations with the two flipped symbols. The number of unsatisfied checks USCN2 is examined (Block 508) and if it is zero, decoding is finished. (Block 518)

If the number USCN2 of unsatisfied checks is greater than zero (and, in some embodiments, less than a correctable error limit), a determination is made as to whether the difference between the number USCN1 of unsatisfied checks in the original unsatisfied check pool USC1 and the number USCN2 in the new unsatisfied check pool USC2 is greater than a predetermined limit. (Block 510) For example, in some embodiments, the determination ensures that the number of unsatisfied checks in the new unsatisfied check pool USC2 is no more than 4 checks more or less than the number of unsatisfied checks in the original unsatisfied check pool USC1. The second stage of the second targeted symbol flipping mode builds on the first, flipping new pairs of symbols exhaustively within the new unsatisfied check pool USC2, in effect flipping two pairs of symbols in combination, one pair in the first stage and one pair in the second stage. If the changes made in the second stage differ too greatly from the first stage, as measured by the number of unsatisfied checks, the combination of the first pair of flipped symbols and the second pair of flipped symbols is discarded as being unproductive and another pair of symbols in the original unsatisfied check pool USC1 is flipped to generate another new unsatisfied check pool USC2. (Block 504)

If, however, the difference the number USCN1 of unsatisfied checks in the original unsatisfied check pool USC1 and the number USCN2 in the new unsatisfied check pool USC2 does not exceed a predetermined limit, exhaustive trials are performed within the new unsatisfied check pool USC2 with the exception of the two flipped symbols B1 and B2 used to generate the new unsatisfied check pool USC2, flipping two symbols at a time, using the real LLR values from the original decoding for the flipped symbols. (Block 512) After each trial, the number of unsatisfied checks produced by the trial is examined (Block 514) and if it is zero, decoding is finished. (Block 518) If the number of unsatisfied checks is not zero for any combination of flipped symbols across the new unsatisfied check pool USC2, stage one is again invoked at Block 504 to create another new unsatisfied check pool USC2 for stage two. If no combination of flipped symbols in stage one and stage two results in all checks being satisfied, another error recovery feature may be invoked (Block 516), such as the third targeted symbol flipping mode, an example embodiment of which is illustrated in FIG. 6.

Simple numeric examples may be provided to further illustrate the operation of the second targeted symbol flipping mode. For example, if variable nodes 0, 1 and 2 are in the original unsatisfied check pool USC1 after the normal decoding operation, in Block 504 two symbols are selected to flip, 0 and 1. A decoding trial is performed in Block 506, generating a new unsatisfied check pool USC2 with a new list of unsatisfied checks, for example containing variable nodes 3, 4 and 5. Because there are three unsatisfied checks, Block 508 does not cause processing to end in Block 518. With three unsatisfied checks in both unsatisfied check pools USC1 and USC2, Block 510 does not bypass the second stage of targeted symbol flipping on the new unsatisfied check pool USC2. Stage two is then performed on the new unsatisfied check pool USC2 by selecting two symbols from the pool, 3 and 4, and performing another decoding trial. If that fails, another pair of symbols are selected from the pool, 3 and 5. If that fails, symbols 4 and 5 are selected from the pool. (Note that if symbols 0 or 1 had appeared in the new unsatisfied check pool USC2, they would have been excluded from flipping in the second stage, because they were already flipped in the first stage.) If no stage two trials eliminate unsatisfied checks, stage one continues at Block 504, selecting another pair of symbols from the original unsatisfied check pool USC1, 0 and 2. Another new unsatisfied check pool USC2 is formed, and exhaustive targeted symbol flipping is performed across new unsatisfied check pool USC2. If this fails to satisfy checks, symbols 1 and 2 are selected at Block 504 in stage one, and stage two trials are performed on the resulting new unsatisfied check pool USC2.

Figure 6:
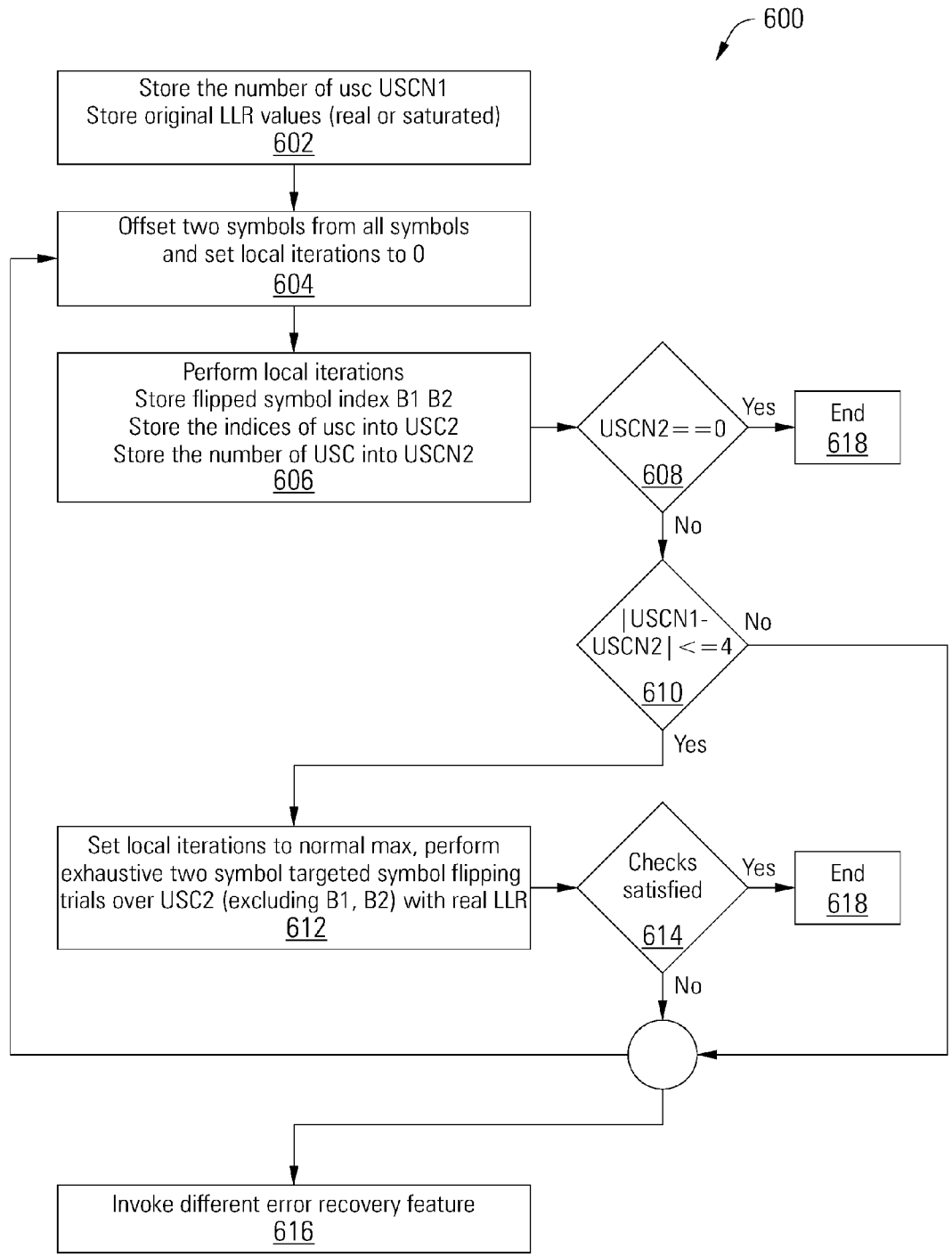
FIG. 6 depicts a flow diagram showing a method for decoding data in a non-binary LDPC decoder using a third targeted symbol flipping mode in accordance with various embodiments of the present invention.

Turning to FIG. 6, a flow diagram 600 shows a method for decoding data in a non-binary LDPC decoder using a third targeted symbol flipping mode in accordance with various embodiments of the present invention. The third targeted symbol flipping mode is similar to the second targeted symbol flipping mode, but instead of limiting the first stage to the unsatisfied check pool from normal decoding, all symbols are included in the targeted symbol flipping when generating new unsatisfied check pools. To reduce latency, full decoding trials are not performed when generating new unsatisfied check pools. Instead, the LDPC decoder is configured to perform no local iterations when decoding is initiated with the two flipped symbols in the input data. This causes the LDPC decoder to simply perform parity checks in the check nodes to output a list of unsatisfied checks, without performing local iterations in an attempt to converge the data. For example, if there are 100 variable nodes, then symbols 0 to 99 (corresponding with the 100 variable nodes) are placed in the original pool. With two symbols flipped in each trial, and 100 symbols to be flipped, there are 4950 possible combinations of flipped symbols, as determined by the equation $n!/(r!(n-r)!)$. Because of the large number of combinations, latency is reduced by performing parity checks without local iterations to generate the new unsatisfied check pools.

Following flow diagram 600, the number of unsatisfied checks in normal decoding is stored, and the original LLR values for those variable nodes are stored, whether real values or saturated values. (Block 602) This may be accomplished in some embodiments by storing the number of unsatisfied checks in a variable USCN1. Two symbols from the unsatisfied check pool are flipped or offset and the LDPC decoder is configured to perform parity checks without local iterations, for example by setting the maximum number of local iterations to zero. (Block 604) The parity check operation is performed with the input data having two flipped symbols, generating a new unsatisfied check pool for use in the second stage. The new unsatisfied check pool is formed by adding all variable nodes connected to check nodes for which parity check constraints are violated with the two flipped symbols to the new unsatisfied check pool USC2. The indices B1 and B2 of the two flipped symbols used to generate the new unsatisfied check pool USC2 are also stored, along with the number of unsatisfied checks USCN2 during the parity checks with the two flipped symbols. (Block 606) The number of unsatisfied checks USCN2 is examined (Block 608) and if it is zero, decoding is finished. (Block 618)

If the number USCN2 of unsatisfied checks is greater than zero (and, in some embodiments, less than a correctable error limit), a determination is made as to whether the difference between the number USCN1 of unsatisfied checks during normal decoding and the number USCN2 in the new unsatisfied check pool USC2 is greater than a predetermined limit. (Block 610) For example, in some embodiments, the determination ensures that the number of unsatisfied checks in the new unsatisfied check pool USC2 is no more than 4 checks more or less than the number of unsatisfied checks during normal decoding. The second stage of the third targeted symbol flipping mode builds on the first stage, flipping new pairs of symbols exhaustively within the new unsatisfied check pool USC2, in effect flipping two pairs of symbols in combination, one pair in the first stage and one pair in the second stage. If the changes made in the second stage differ too greatly from the first stage, as measured by the number of unsatisfied checks, the combination of the first pair of flipped symbols and the second pair of flipped symbols is discarded as being unproductive and another pair of symbols from all symbols is flipped to generate another new unsatisfied check pool USC2. (Block 604)

If, however, the difference the number USCN1 of unsatisfied checks in the normal decoding and the number USCN2 in the new unsatisfied check pool USC2 does not exceed a predetermined limit, exhaustive trials are performed within the new unsatisfied check pool USC2 with the exception of the two flipped symbols B1 and B2 used to generate the new unsatisfied check pool USC2, flipping two symbols at a time, using the real LLR values from the original decoding for the flipped symbols. (Block 612) In stage two, local decoding iterations are performed rather than simply performing parity checks, for example by configuring the LDPC decoder with a maximum local iteration limit greater than zero, such as 63. After each trial, the number of unsatisfied checks produced by the trial is examined (Block 614) and if it is zero, decoding is finished. (Block 618) If the number of unsatisfied checks is not zero for any combination of flipped symbols across the new unsatisfied check pool USC2, stage one is again invoked at Block 604 to create another new unsatisfied check pool USC2 for stage two. If no combination of flipped symbols in stage one and stage two results in all checks being satisfied, another error recovery feature may be invoked (Block 616).

The non-binary LDPC decoder with targeted symbol flipping is not limited to the number of modes or the number of simultaneous symbols flipped disclosed in the examples above. For example, other embodiments of a non-binary LDPC decoder with targeted symbol flipping may include more or less symbol flipping modes, and may flip more than two symbols simultaneously.

Figure 7:
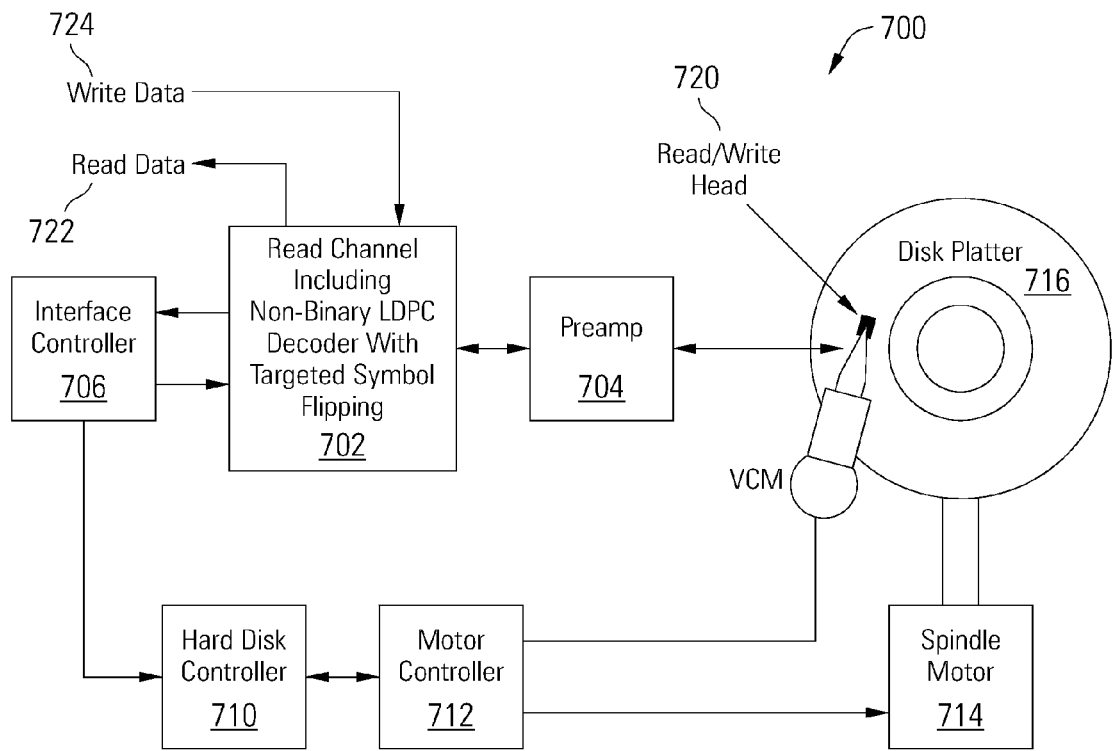
FIG. 7 depicts a storage system including a non-binary LDPC decoder with targeted symbol flipping in accordance with some embodiments of the present invention.
Figure 8:
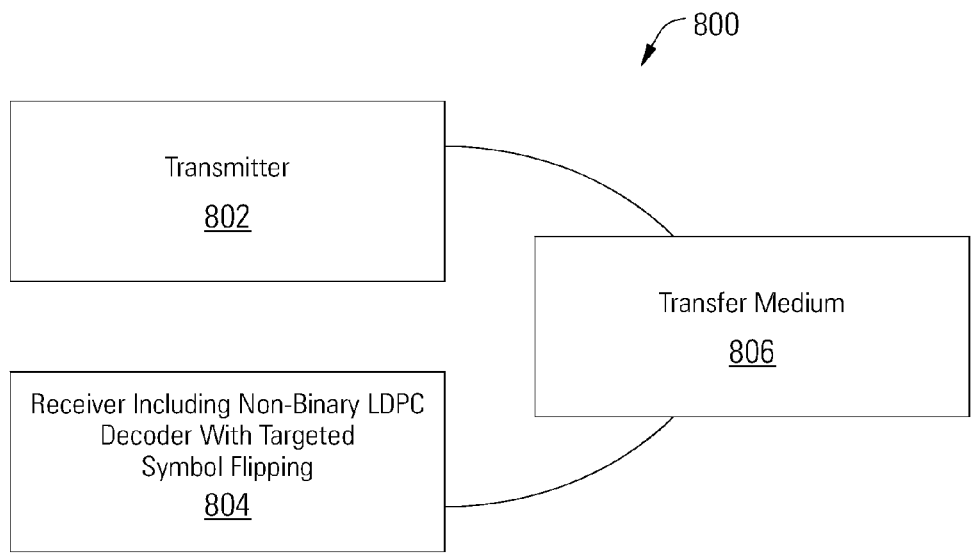
FIG. 8 depicts a wireless communication system including a non-binary LDPC decoder with targeted symbol flipping in accordance with some embodiments of the present invention.

Although the non-binary LDPC decoder with targeted symbol flipping disclosed herein is not limited to any particular application, several examples of applications are presented in FIGS. 7 and 8 that benefit from embodiments of the present invention. Turning to FIG. 7, a storage system 700 is illustrated as an example application of a non-binary LDPC decoder with targeted symbol flipping in accordance with some embodiments of the present invention. The storage system 700 includes a read channel circuit 702 with a non-binary LDPC decoder with targeted symbol flipping in accordance with some embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 decodes and digitizes the received analog signal to recreate the information originally written to disk platter 716. This data is provided as read data 722 to a receiving circuit. As part of decoding the received information, read channel circuit 702 processes the received signal using a non-binary LDPC decoder with targeted symbol flipping. Such a non-binary LDPC decoder with targeted symbol flipping may be implemented consistent with that disclosed above in relation to FIG. 2. In some cases, the decoding may be performed consistent with the flow diagrams disclosed above in relation to FIGS. 3-6. A write operation is substantially the opposite of the preceding read operation with write data 724 being provided to read channel circuit 702. This data is then encoded and written to disk platter 716.

It should be noted that storage system 700 may be integrated into a larger storage system such as, for example, a RAID (redundant array of inexpensive disks or redundant array of independent disks) based storage system. It should also be noted that various functions or blocks of storage system 700 may be implemented in either software or firmware, while other functions or blocks are implemented in hardware.

Turning to FIG. 8, a wireless communication system 800 or data transmission device including a receiver 804 with a non-binary LDPC decoder with targeted symbol flipping is shown in accordance with some embodiments of the present invention. Communication system 800 includes a transmitter 802 that is operable to transmit encoded information via a transfer medium 806 as is known in the art. The encoded data is received from transfer medium 806 by receiver 804. Receiver 804 incorporates a non-binary LDPC decoder with targeted symbol flipping. Such a non-binary LDPC decoder with targeted symbol flipping may be implemented consistent with that described above in relation to FIG. 2. In some cases, the decoding may be done consistent with the flow diagrams discussed above in relation to FIGS. 3-6.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for decoding data in a non-binary LDPC decoder with targeted symbol flipping. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A non-binary low density parity check data decoder comprising:
   a variable node processor operable to update variable node symbol values according to a plurality of elements in a non-binary Galois Field;
   a check node processor connected to the variable node processor and operable to perform parity check calculations; and
   a controller operable to perform symbol flipping and to control decoding iterations in the variable node processor and the check node processor, wherein symbols to be flipped in the symbol flipping are selectively chosen from sets of check nodes for which parity check constraints are violated, wherein the controller is operable to perform the symbol flipping in a plurality of modes of operation, at least one of which comprises flipping a single symbol value at a time and at least one of which comprises flipping multiple symbol values at a time.

2. The non-binary low density parity check data decoder of claim 1, wherein the symbol flipping comprises changing at least one of the variable node symbol values to another of the plurality of elements in the non-binary Galois Field.

3. The non-binary low density parity check data decoder of claim 2, further comprising a symbol memory connected to the variable node processor, wherein the controller is operable to change the at least one of the variable node symbol values in the symbol memory.

4. The non-binary low density parity check data decoder of claim 2, wherein changing the at least one of the variable node symbol values comprises setting a hard decision value and a corresponding log likelihood ratio value.

5. The non-binary low density parity check data decoder of claim 1, wherein each of the plurality of modes of operation is sequentially invoked if a previously invoked one of the plurality of modes of operation failed to satisfy all check node constraints.

6. The non-binary low density parity check data decoder of claim 1, wherein a first of the plurality of modes of operation comprises flipping a value of a single symbol at a time across a pool of symbols in an unsatisfied check pool and performing local decoding iterations.

7. The non-binary low density parity check data decoder of claim 6, wherein flipping the value of the single symbol at a time comprises setting a hard decision and saturating a corresponding log likelihood ratio value.

8. The non-binary low density parity check data decoder of claim 6, wherein a second of the plurality of modes of operation comprises a first stage in which a plurality of new unsatisfied check pools are generated by performing double symbol flipping across the unsatisfied check pool and performing local decoding iterations, and a second stage comprising performing double symbol flipping across each of the plurality of new unsatisfied check pools and performing local decoding iterations.

9. The non-binary low density parity check data decoder of claim 8, wherein symbols flipped in the first stage are not flipped in the second stage.

10. The non-binary low density parity check data decoder of claim 8, wherein a third of the plurality of modes of operation comprises a third mode first stage in which a second plurality of new unsatisfied check pools are generated by performing double symbol flipping across the unsatisfied check pool and performing parity checks without local decoding iterations, and a third mode second stage comprising performing double symbol flipping across each of the second plurality of new unsatisfied check pools and performing local decoding iterations.

11. The non-binary low density parity check data decoder of claim 1, wherein the variable node processor and check node processor are operable to decode a low density parity check code comprising a plurality of variable nodes and a plurality of check nodes, wherein the controller is operable to perform a symbol flipping mode of operation comprising:
   forming an unsatisfied check pool containing symbols from all of the plurality of variable nodes that are connected to check nodes from the plurality of check nodes that violate check node constraints during a decoding operation; and
   performing a decoding trial for each of the symbols in the unsatisfied check pool, flipping a value of each symbol one at a time through each of the plurality of elements in the non-binary Galois Field, and determining whether the check node constraints are all satisfied in any of the decoding trials.

12. The non-binary low density parity check data decoder of claim 1, wherein the variable node processor and check node processor are operable to decode a low density parity check code comprising a plurality of variable nodes and a plurality of check nodes, wherein the controller is operable to perform a symbol flipping mode of operation comprising:
   forming an unsatisfied check pool containing symbols from all of the plurality of variable nodes that are connected to check nodes from the plurality of check nodes that violate check node constraints during a decoding operation;
   generating a plurality of new unsatisfied check pools by flipping values of pairs of the symbols in the unsatisfied check pool through each of the plurality of elements in the non-binary Galois Field, and performing a first decoding trial for each unique set of symbol values; and
   performing second decoding trials for each of the new unsatisfied check pools, flipping values of pairs of the symbols in each of the new unsatisfied check pools through each of the plurality of elements in the non-binary Galois Field, and determining whether the check node constraints are all satisfied in any of the decoding trials.

13. The non-binary low density parity check data decoder of claim 1, wherein the variable node processor and check node processor are operable to decode a low density parity check code comprising a plurality of variable nodes and a plurality of check nodes, wherein the controller is operable to perform a symbol flipping mode of operation comprising:
   forming a pool containing symbols from all of the plurality of variable nodes;
   generating a plurality of new unsatisfied check pools by flipping values of pairs of the symbols in the unsatisfied check pool through each of the plurality of elements in the non-binary Galois Field, and performing a parity check calculation without decoding iterations for each unique set of symbol values; and
   performing second decoding trials for each of the new unsatisfied check pools, flipping values of pairs of the symbols in each of the new unsatisfied check pools through each of the plurality of elements in the non-binary Galois Field, and determining whether all check node constraints are satisfied in any of the decoding trials.

14. The non-binary low density parity check data decoder of claim 1, wherein the variable node processor, the check node processor and the controller are implemented as an integrated circuit.

15. The non-binary low density parity check data decoder of claim 1, wherein the variable node processor, the check node processor and the controller are incorporated in a storage device.

16. The non-binary low density parity check data decoder of claim 1, wherein the variable node processor, the check node processor and the controller are incorporated in a data transmission device.

17. A method for decoding low density parity check encoded data, comprising:
    performing a limited number of global and local decoding iterations in an integrated circuit non-binary low density parity check data decoder; and
    when the global and local decoding iterations fail to converge by satisfying all check node parity checks, performing a symbol flipping operation comprising exhaustively flipping values of symbols in the encoded data across all elements of a Galois Field associated with the non-binary low density parity check data decoder, wherein symbols to be flipped are selectively chosen from sets of check nodes for which parity check constraints are violated, wherein the symbol flipping operation comprises a plurality of operating modes at least one of which comprises flipping a single symbol value at a time and at least one of which comprises flipping multiple symbol values at a time.

18. The method of claim 17, wherein flipping the values of the symbols comprises setting a hard decision and saturating a corresponding log likelihood ratio value.

19. A storage system comprising:
    a storage medium maintaining a data set;
    a read/write head assembly operable to sense the data set on the storage medium and to provide an analog output corresponding to the data set;
    an analog to digital converter operable to sample a continuous signal to yield a digital output; and
    a non-binary low density parity check data decoder operable to decode data in the digital output, comprising:
    a variable node processor operable to update variable node symbol values according to a plurality of elements in a non-binary Galois Field;
    a check node processor connected to the variable node processor and operable to perform parity check calculations; and
    a controller operable to perform symbol flipping and to control decoding iterations in the variable node processor and the check node processor, wherein symbols to be flipped in the symbol flipping are selectively chosen from sets of check nodes for which parity check constraints are violated, and wherein the controller is operable to perform the symbol flipping in a plurality of modes of operation, at least one of which comprises flipping a single symbol value at a time and at least one of which comprises flipping multiple symbol values at a time.

20. The storage system of claim 19, wherein flipping the values of the symbols comprises setting a hard decision and saturating a corresponding log likelihood ratio value.

* * * * *